United States Patent
Kamiya

(10) Patent No.: US 11,237,213 B2
(45) Date of Patent: Feb. 1, 2022

(54) MOTOR INFORMATION ACQUISITION SYSTEM

(71) Applicant: Fanuc Corporation, Yamanashi (JP)

(72) Inventor: Yohei Kamiya, Yamanashi (JP)

(73) Assignee: Fanuc Corporation, Yamanashi (JP)

( * ) Notice: Subject to any disclaimer, the term of this patent is extended or adjusted under 35 U.S.C. 154(b) by 0 days.

(21) Appl. No.: 16/909,021

(22) Filed: Jun. 23, 2020

(65) Prior Publication Data

US 2021/0003637 A1    Jan. 7, 2021

(30) Foreign Application Priority Data

Jul. 5, 2019  (JP) .............................. JP2019-126171

(51) Int. Cl.
   *G01R 31/34*  (2020.01)
(52) U.S. Cl.
   CPC .................................. *G01R 31/343* (2013.01)
(58) Field of Classification Search
   CPC ..... H02K 1/2766; G01R 31/343; H02P 6/085; H02P 21/18; H02P 6/28
   See application file for complete search history.

(56) References Cited

U.S. PATENT DOCUMENTS

| 2010/0327786 A1* | 12/2010 | Aoki | H02P 6/16 318/400.04 |
| 2017/0063261 A1* | 3/2017 | Tsutsumi | H02P 23/14 |

FOREIGN PATENT DOCUMENTS

JP    2018132809 A    8/2018

* cited by examiner

*Primary Examiner* — Alesa Allgood
(74) *Attorney, Agent, or Firm* — RatnerPrestia

(57) ABSTRACT

A motor information acquisition system is provided that acquires information representing an operation state of a motor included in a machine tool in order to monitor a state of the machine tool and that includes a motor control device configured to control the motor based on control data, a timing generation section configured to generate acquisition timing of the information representing the operation state of the motor based on the control data, a rotor magnetic flux reduction command output section configured to output a command for reducing a magnetic flux density of a rotor of the motor to the motor control device when the acquisition timing is reached, and a motor information acquisition section configured to acquire information representing the operation state of the motor when the magnetic flux density of the rotor is reduced by the command.

4 Claims, 3 Drawing Sheets

MOTOR INFORMATION ACQUISITION SYSTEM

CROSS-REFERENCE TO RELATED APPLICATIONS

This application is a new U.S. Patent Application that claims benefit of Japanese Patent Application No. 2019-126171, dated Jul. 5, 2019, the disclosure of which is incorporated herein by reference in its entirety for all purposes.

BACKGROUND OF THE INVENTION

1. Field of the Invention

The present invention relates to a motor information acquisition system that acquires information representing an operation state of a motor.

2. Description of the Related Art

In a production facility using a machine tool, etc., it is important, from the perspective of preventing a failure of the machine tool, etc., to monitor the state of the machine tool at normal times so that failure prediction and failure diagnosis can be performed. Japanese Unexamined Patent Application Publication No. 2018-132809 discloses that acquisition of diagnostic data is started by determining, based on control data for controlling a machine tool, that it becomes possible to acquire the diagnostic data when the speed of a spindle axis becomes constant and the spindle axis becomes a state of no-load (paragraph 0057).

SUMMARY OF THE INVENTION

However, an extremely small change in a state of a bearing, a ball screw, or the like in the machine tool may not be detected in a system for acquiring a signal (current, torque, speed, position, temperature, etc.) representing the state of the motor. It is desired to configure the system to be able to detect such an extremely small state change so that the performance of failure prediction and failure diagnosis is improved.

An aspect of the present disclosure is a motor information acquisition system that acquires information representing an operation state of a motor included in a machine tool in order to monitor a state of the machine tool, the motor information acquisition system including: a motor control device configured to control the motor based on control data; a timing generation section configured to generate acquisition timing of the information representing the operation state of the motor based on the control data; a rotor magnetic flux reduction command output section configured to output a command for reducing a magnetic flux density of a rotor of the motor to the motor control device when the acquisition timing is reached; and a motor information acquisition section configured to acquire the information representing the operation state of the motor when the magnetic flux density of the rotor is reduced by the command.

BRIEF DESCRIPTION OF THE DRAWINGS

The objects, features and advantages of the present invention will become more apparent from the description of the following embodiments in connection with the accompanying drawings. In the accompanying drawings.

DETAILED DESCRIPTION

Figure 1:
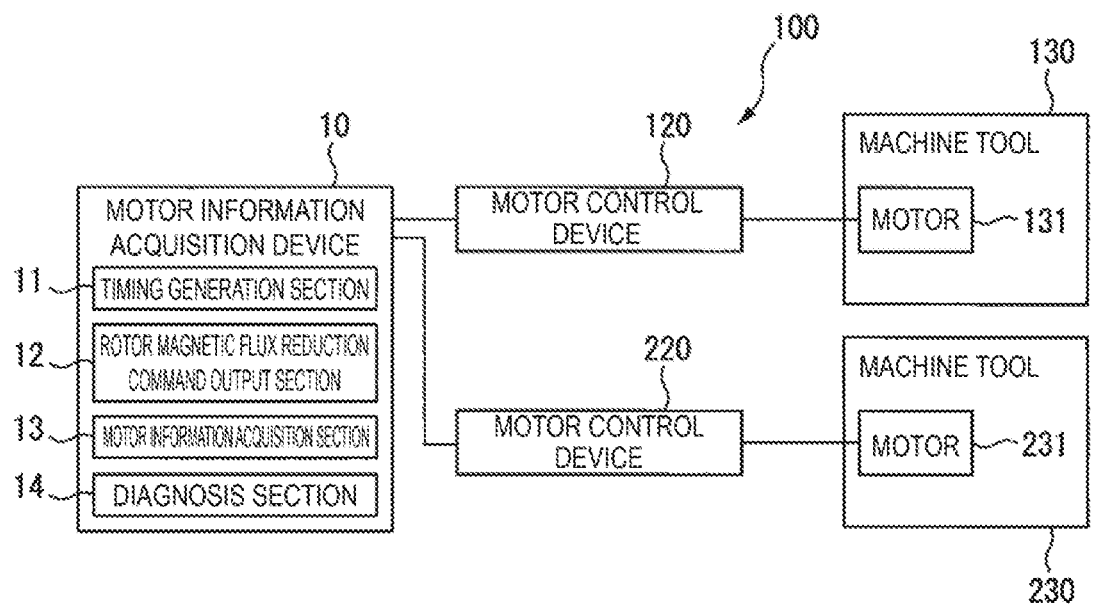
FIG. 1 is a diagram illustrating an overall configuration of a motor information acquisition system according to an embodiment.

Embodiments of the present disclosure will be described below with reference to the accompanying drawings. Throughout the drawings, corresponding components are denoted by common reference numerals. The drawings are scaled appropriately to facilitate understanding. Moreover, the embodiments illustrated in the drawings are examples for implementing the present invention, and the present invention is not limited to the embodiments illustrated in the drawings.

FIG. 1 is a diagram illustrating an overall configuration of a motor information acquisition system 100 according to an embodiment. As illustrated in FIG. 1, the motor information acquisition system 100 includes a motor information acquisition device 10, motor control devices 120 and 220 connected to the motor information acquisition device 10, and machine tools 130 and 230 connected to the motor control devices 120 and 220, respectively. The connection between these devices may be a direct connection through an input/output interface or a connection through a network such as a Local Area Network (LAN). FIG. 1 illustrates a configuration example in which two sets of machining systems each including a motor control device and a machine tool are provided, but the number of machining systems including a motor control device and a machine tool may be one, or three or more. In the configuration example illustrated in FIG. 1, the motor information acquisition device 10 can collect data for diagnosis or the like from each of the two sets of machining systems.

Each of the machine tools 130 and 230 includes a plurality of motors such as a motor for a spindle axis for machining a workpiece and a motor for a feed axis, but one motor (131, 231) is illustrated in FIG. 1 as a representative. In the following, explanations are given for the functions of the motor control device 120 and the machine tool 130, and the explanations are also applied to the functions of the motor control device 220 and the machine tool 230.

The motor control device 120 has a function as a control device for controlling the motor 131 based on control data, and also has a function as an amplifier for outputting a drive signal for driving the motor 131. That is, the motor control device 120 executes general feedback control for the motor 131 based on an operation command generated from the machining program. Therefore, the motor control device 120 can obtain feedback signals produced in the feedback control for the motor 131. In the present specification, the control data represents data used for controlling the motor 131, which includes information based on a machining program and information acquired by the feedback control such as feedback signals. The feedback signals include a position signal representing a position of the motor 131, a speed signal representing the speed of the motor 131, and a current signal representing a current flowing through the motor 131, or the like.

The speed signal is calculated, for example, by differentiating a position signal detected by a rotary encoder included in the motor 131. The current signal can be detected, for example, by measuring a current flowing through the motor 131. Further, the motor control device 120 or a timing generation section 11 can determine load torque applied to the motor 131 based on the current signal.

As illustrated in FIG. 1, the motor information acquisition device 10 includes the timing generation section 11, a rotor magnetic flux reduction command output section 12, and a motor information acquisition section 13. The motor information acquisition device 10 may further include a diagnosis section 14 which will be described later. The timing generation section 11 acquires control data from the motor control device 120.

As mentioned above, the control data includes an operation command based on the machining program and the feedback signals described above. The timing generation section 11 generates, by using the control data, acquisition timing that is timing to acquire information representing the operation state of the motor 131. In the present embodiment, the motor information acquisition device 10 collects waveform data of a signal (a current signal, a speed signal, or the like) representing an operation state of the motor 131 as information representing the operation state of the motor 131.

Figure 2:
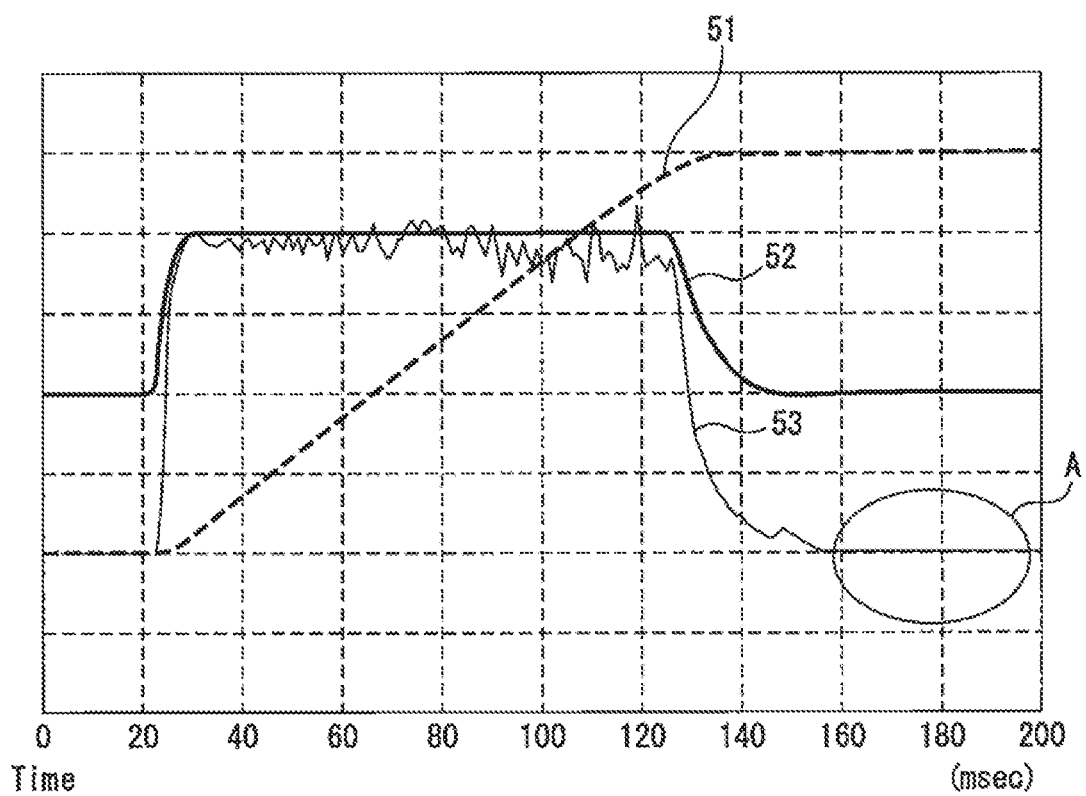
FIG. 2 is a diagram for illustrating an example of waveform data acquisition timing.

FIG. 2 is a diagram for explaining an example of acquisition timing generated by the timing generation section 11. In FIG. 2, a waveform 52 represents a current command given to the motor 131, a waveform 53 represents a current signal, and a waveform 51 represents a speed signal. A portion surrounded by a round mark A in FIG. 2 corresponds to acquisition timing generated by the timing generation section 11. As illustrated in FIG. 2, a portion where the rotational speed of the motor 131 has become constant after increasing with the input of a current command and where the current flowing through the motor 131 is at a low level (low load or no load) is the acquisition timing. That is, the timing generation section 11 defines the timing when the motor 131 is at a constant speed and with a low load (or no load) as acquisition timing. By collecting information representing the operation state of the motor when the motor is at a constant speed and with a low load (or no load), it is easy to find a failure or deterioration in the machine tool.

The rotor magnetic flux reduction command output section 12 outputs, when the acquisition timing is detected by the timing generation section 11, a command for reducing the magnetic flux density of the rotor of the motor 131 to the motor control device 120, thereby reducing the magnetic flux density of the rotor of the motor 131. In this case, various command forms, such as a command in a command data format and a command by a trigger signal, can be used. The reason why the information representing the operation state of the motor 131 is acquired in a state where the magnetic flux density of the rotor is reduced will now be described. In general, when a motor is operated in a machining process, the magnetic flux density of a rotor is set to have a sufficient strength to obtain appropriate following characteristics to a command. On the other hand, when the magnetic flux density of the rotor is weakened, the motor reduces in ability to follow the command, and the influence of disturbance easily appears in a current waveform, a speed waveform, or the like. Based on such knowledge, the motor information acquisition device 10 acquires information representing the operation state of the motor 131 after reducing the magnetic flux density of the rotor of the motor 131. With such a configuration, an extremely small state change of a bearing or a ball screw in the machine tool 130 can be captured as waveform data, for example.

The motor information acquisition section 13 collects and stores waveform data of a signal representing an operation state of the motor 131 while the magnetic flux density of the rotor of the motor 131 is reduced during the acquisition timing. Note that the timing generation section 11 sets, as the acquisition timing, the timing such as just before the tool driven by the motor 131 cuts into the workpiece so that reduction in the magnetic flux density of the rotor does not affect the machining. The motor information acquisition device 10 having such a function may have a configuration as a general computer including a CPU, a ROM, a RAM, a storage device, a communication interface, an operation section, a display section, etc.

Figure 3:
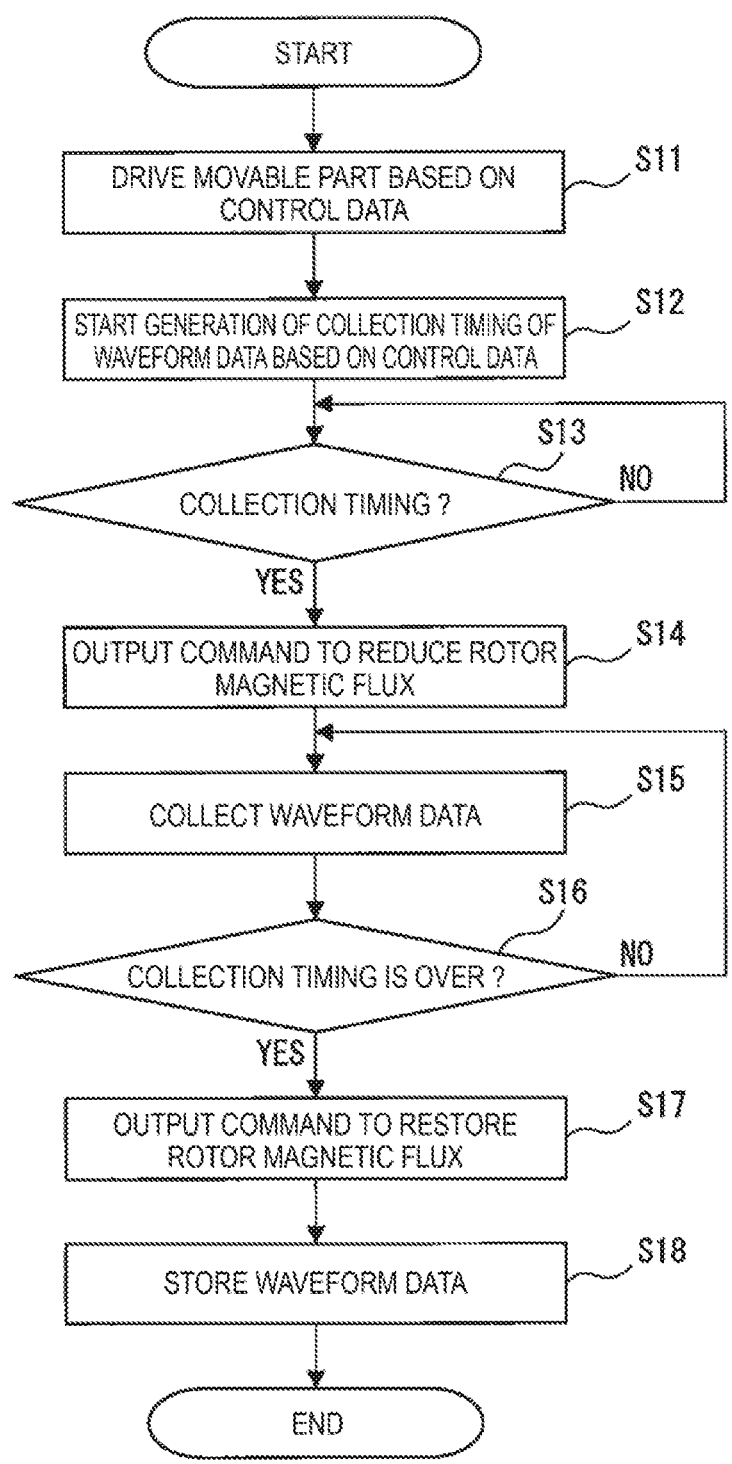
FIG. 3 is a flow chart illustrating a waveform data acquisition process.

FIG. 3 is a flow chart representing a waveform data acquisition process in the motor information acquisition system 100. The waveform data acquisition process is mainly performed under the control of the CPU of the motor information acquisition device 10. First, driving of a movable part of the machine tool based on the control data is started by the motor control device 120 (step S11). Next, generation of acquisition timing of the waveform data by the timing generation section 11 is started (step S12). The timing generation section 11 determines, based on the speed signal and the current signal (load torque information) of the motor 131 obtained from the motor control device 120, that the waveform data acquisition timing is reached when the motor 131 is at a constant speed and with a low load (or no load). Here, when the load torque becomes lower than a preset threshold, the timing generation section 11 may determine that the motor is with a low load or no load. The threshold in this case may be set as an empirical value or an experimental value. When the timing generation section 11 determines that the acquisition timing has come by such a determination manner (S13: YES), the rotor magnetic flux reduction command output section 12 outputs a command to reduce the magnetic flux density of the rotor of the motor 131 to the motor control device 120, thereby reducing the magnetic flux density of the rotor of the motor 131 (step S14).

Then, the motor information acquisition section 13 collects waveform data of a signal (a current signal, a speed signal, or the like) representing an operation state of the motor 131 in a state where the magnetic flux density of the motor 131 is reduced (step S15). Next, the timing generation section 11 determines whether the acquisition timing has ended (step S16). Here, as an example, the timing generation section 11 determines that the acquisition timing ends at the timing when the tool driven by the motor 131 starts cutting into the workpiece and the load torque starts to rise (S16: YES). While the acquisition timing continues, the motor information acquisition section 13 continues to collect the waveform data (S16: NO).

When it is determined that the acquisition timing ends (S16: YES), the rotor magnetic flux reduction command output section 12 outputs, to the motor control device 120, a command for restoring the reduced magnetic flux density of the rotor to the original state, thereby causing the magnetic flux density of the rotor to restore to the original state (step S17). Then, the motor information acquisition section 13 stores the collected waveform data (step S18). Note that the motor information acquisition section 13 stores waveform data, during the acquisition timing, up to a time preceding by a predetermined period of time from the end of the acquisition timing, so as not to collect the waveform data after cutting into the workpiece.

By the waveform data acquisition process described above, waveform data useful for state monitoring can be collected in an actual machining process by the machine tool 130. That is, there is no need for executing a test operation of the machining system to collect the waveform data.

Figure 4:
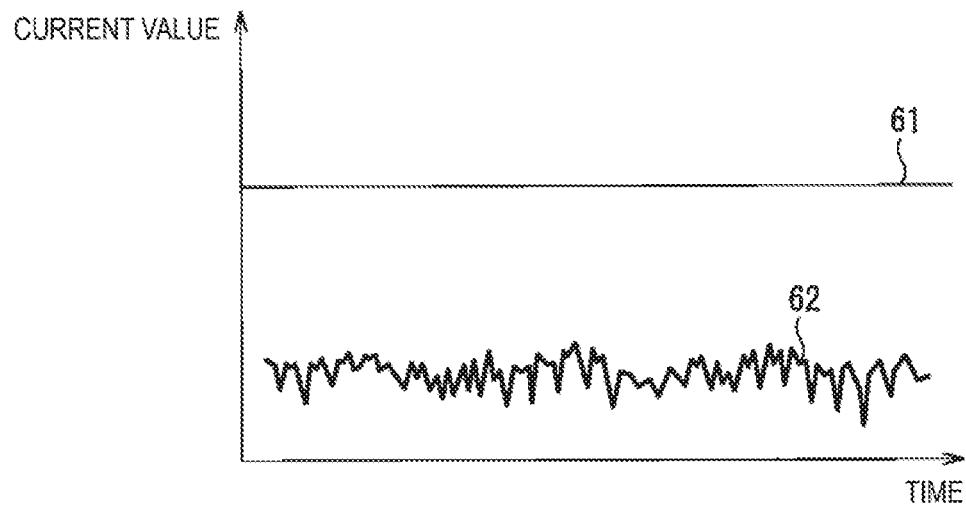
FIG. 4 is a diagram illustrating, in the case where there is an extremely weak disturbance, a current waveform when an induction motor is in a normal state and a current waveform when an exciting current of the induction motor is reduced.

Next, specific examples of the waveform data acquired by the waveform data acquisition process in FIG. 3 will be described for a case where the motor 131 is an induction motor and for a case where the motor 131 is a synchronous motor. In the case where the motor 131 is an induction motor, the motor control device 120 reduces the magnetic flux density of the rotor by reducing an exciting current from a normal state. FIG. 4 is a diagram illustrating a current waveform 61 (current signal) flowing through the motor 131 in a normal state, and a current waveform 62 flowing through the motor 131 when the exciting current is reduced in the case where the motor 131 is an induction motor. The current waveforms 61 and 62 are waveforms when the same extremely weak disturbance occurs.

In the normal current waveform 61 of FIG. 4, even when an extremely weak disturbance is generated, the motor 131 can adequately follow the command (constant current command), so that turbulences of the current waveform due to the influence of disturbance do not occur. On the other hand, in the current waveform 62 when the exciting current is reduced, the force by which the motor 131 follows the command (a constant current command) is weakened, so that even an extremely weak disturbance can affect the current waveform to cause the turbulences as illustrated. Therefore, the motor information acquisition device 10 can collect waveform data representing the influence of an extremely weak disturbance such as the current waveform 62.

Figure 5:
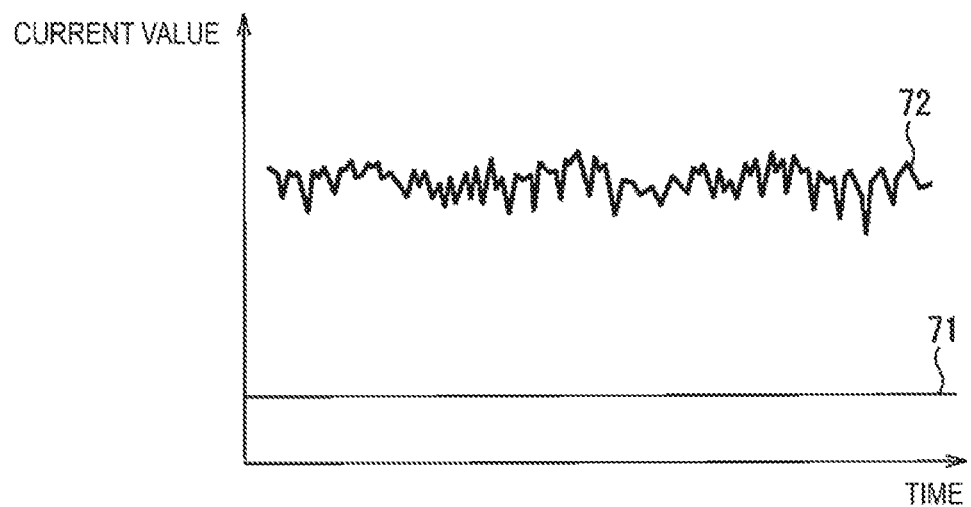
FIG. 5 is a diagram illustrating, in the case where there is an extremely weak disturbance, a current waveform when a synchronous motor is in a normal state and a current waveform when a D-phase current of the synchronous motor flows.

When the motor 131 is a synchronous motor, the motor control device 120 performs the D-phase current control where the D-phase current which is not caused to flow at a normal time is caused to flow or the D-phase current which is larger than that at a normal time is caused to flow, thereby reducing the magnetic flux of the rotor of the motor 131. In a synchronous motor, since the D-phase current generally acts to weaken the magnetic flux density of a permanent magnet of the rotor and does not contribute to the generation of torque, such control is possible. FIG. 5 illustrates a current waveform 71 flowing through the motor 131 at a normal time, and a current waveform 72 flowing through the motor 131 when a D-phase current is made to flow or is increased more than that at a normal time in the case where the motor 131 is a synchronous motor. The current waveforms 71 and 72 are waveforms when the same extremely weak disturbance occurs.

In the normal current waveform 71 of FIG. 5, even when an extremely weak disturbance is generated, the motor 131 can adequately follow the command (constant current command), so that turbulences of the current waveform due to the influence of disturbance do not occur. In the synchronous motor, when the magnetic flux density of the rotor is reduced by causing the D-phase current to flow, the Q-phase current is increased to maintain torque, and therefore the level of the current waveform 72 representing the total amount of current is increased more than the normal current waveform 71. In the current waveform 72 when the D-phase current is made to flow (or increased more than that at a normal time), the force by which the motor 131 follows the command (a constant current command) is weakened, so that even an extremely weak disturbance can affect the current waveform to cause the turbulences as illustrated.

Therefore, the motor information acquisition device 10 can collect waveform data representing the influence of an extremely weak disturbance such as the current waveform 72.

Note that in FIGS. 4 and 5, a state where an extremely weak disturbance appears in the current waveform is illustrated, but in a state where the magnetic flux density of the rotor is reduced as described above, disturbance may also occur in the speed signal due to an extremely weak disturbance. Therefore, the waveform data of the speed signal may be collected.

The waveform data acquired by the motor information acquisition device 10 as described above can be used for failure prediction and failure diagnosis of each of the machine tools 130 and 230. For example, the period and amplitude of the vibration may be extracted from the collected waveform data as parameters representing the characteristics of the collected waveform data, and the diagnosis may be performed by comparing these values of the parameters with preset thresholds. As illustrated in FIG. 1, the motor information acquisition device 10 may include the diagnosis section 14 configured to perform such a diagnosis. Note that the motor information acquisition device 10 can acquire various information including a current value, torque, a speed, a position, a temperature, or the like, of the motor (131, 231) as information representing the operation state of the motor. The information that can be used by the diagnosis section 14 for diagnosing the machine tool includes instantaneous values of the above described various types of information in addition to time-series data such as the waveform data in the above-described embodiment.

As described above, according to the present embodiment, it is possible to acquire the information for detecting an extremely small change in the state of a bearing, a ball screw, or the like.

While the embodiments according to the present disclosure has been described above, it will be understood, by those skilled in the art, that various changes or modifications may be made thereto without departing from the scope of the following claims.

The configuration of the motor information acquisition system 100 illustrated in FIG. 1 is an example, and various modifications can be configured. For example, the function of the motor information acquisition device 10 may be provided in the motor control device 120. Alternatively, functions as the motor information acquisition device 10 and the motor control device 120 may be provided in the machine tool 130.

The program for executing the waveform data acquisition process illustrated in the above-described embodiment can be recorded on various kinds of computer-readable recording media (e.g., semiconductor memories such as ROM, EEPROM, flash memory, magnetic recording media, optical disks such as CD-ROM, DVD-ROM).

The invention claimed is:
1. A motor information acquisition system that acquires information representing an operation state of a motor included in a machine tool in order to monitor a state of the machine tool, the motor information acquisition system comprising:

a controller configured to control the motor based on control data, wherein the control data includes an operation command generated from a machining program; and a processor configured to:

generate acquisition timing to acquire the information representing the operation state of the motor based on the control data, wherein, in the acquisition timing, the motor reaches a constant speed and a current flowing through the motor is a level lower than a preset threshold;

output, when the acquisition timing is generated, a command to reduce a magnetic flux density of a rotor of the motor to the controller; and acquire the information representing the operation state of the motor for the acquisition timing after reducing the magnetic flux of the rotor of the motor based upon the command.

2. The motor information acquisition system according to claim 1, wherein the motor is an induction motor, and the controller reduces an exciting current of the induction motor in response to the command.

3. The motor information acquisition system according to claim 1, wherein the motor is a synchronous motor, and the controller increases a D-phase current of the synchronous motor in response to the command.

4. The motor information acquisition system according to claim 1, wherein the information representing the operation state of the motor includes waveform data of at least one of a current signal representing a current flowing through the motor and a speed signal representing a speed of the motor.

* * * * *

UNITED STATES PATENT AND TRADEMARK OFFICE
CERTIFICATE OF CORRECTION

PATENT NO. : 11,237,213 B2  
APPLICATION NO. : 16/909021  
DATED : February 1, 2022  
INVENTOR(S) : Yohei Kamiya Page 1 of 1

It is certified that error appears in the above-identified patent and that said Letters Patent is hereby corrected as shown below:

In the Claims

Claim 1, Column 7, Line 1, delete "controller" and insert -- motor control device --

Claim 1, Column 7, Lines 2-4, delete ", wherein the control data includes an operation command generated from a machining program"

Claim 1, Column 7, Line 14, delete "controller" and insert -- motor control device --

Claim 2, Column 8, Line 4, delete "controller" and insert -- motor control device --

Claim 3, Column 8, Line 9, delete "controller" and insert -- motor control device --

Signed and Sealed this  
Twelfth Day of April, 2022

Drew Hirshfeld  
*Performing the Functions and Duties of the*  
*Under Secretary of Commerce for Intellectual Property and*  
*Director of the United States Patent and Trademark Office*